(12) United States Patent
Sharma et al.

(10) Patent No.: US 11,024,379 B2
(45) Date of Patent: Jun. 1, 2021

(54) METHODS AND SYSTEMS FOR HIGHLY OPTIMIZED MEMRISTOR WRITE PROCESS

(71) Applicant: Hewlett Packard Enterprise Development LP, Houston, TX (US)

(72) Inventors: Amit Sharma, Palo Alto, CA (US); John Paul Strachan, Palo Alto, CA (US); Suhas Kumar, Palo Alto, CA (US); Catherine Graves, Palo Alto, CA (US); Martin Foltin, Fort Collins, CO (US); Craig Warner, Plano, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/667,773

(22) Filed: Oct. 29, 2019

(65) Prior Publication Data

US 2021/0125667 A1     Apr. 29, 2021

(51) Int. Cl.
*G11C 11/00*     (2006.01)
*G11C 13/00*     (2006.01)

(52) U.S. Cl.
CPC ........ *G11C 13/0069* (2013.01); *G11C 13/003* (2013.01); *G11C 2013/0092* (2013.01); *G11C 2213/15* (2013.01); *G11C 2213/72* (2013.01)

(58) Field of Classification Search
CPC .............. G11C 13/0069; G11C 13/003; G11C 2013/0092; G11C 2213/15; G11C 2213/72
USPC ........................................................ 365/148
See application file for complete search history.

(56) References Cited

U.S. PATENT DOCUMENTS

| 8,023,345 | B2 | 9/2011 | Breitwisch et al. | |
| 10,157,668 | B2 | 12/2018 | Whitaker et al. | |
| 2014/0376297 | A1 | 12/2014 | Lasser | |
| 2017/0206956 | A1* | 7/2017 | Foltin | G11C 13/0097 |
| 2018/0108410 | A1* | 4/2018 | Whitaker | G11C 13/0064 |

(Continued)

OTHER PUBLICATIONS

Cong Xu et al., "Understanding the Trade-offs in Multi-level Cell Rerammemory Design," Jun. 7, 2013, pp. 1-6, ACM.

(Continued)

*Primary Examiner* — Tha-O H Bui
(74) *Attorney, Agent, or Firm* — Sheppard Mullin Richter & Hampton LLP

(57) ABSTRACT

Systems and methods for providing write process optimization for memristors are described. Write process optimization circuitry manipulates the memristor's write operation, allowing the number of cycles in the write process is reduced. Write process optimization circuitry can include write current integration circuitry that measures an integral of a write current over time. The write optimization circuitry can also include shaping circuitry. The shaping circuitry can shape a write pulse, by determining the pulse's termination, width, and slope. The write pulse is shaped depending upon whether the target memristor device exhibits characteristics of "maladroit" cells or "adroit" cells. The pulse shaping circuitry uses the integral and measured write current to terminate the write pulse in a manner that allows the memristor, wherein having maladroit cells and adroit cells, to reach a target state. Thus, utility of memristors is enhanced by realizing an optimized write process with decrease latency and improved efficiency.

19 Claims, 9 Drawing Sheets

(56) References Cited

U.S. PATENT DOCUMENTS

2018/0204617 A1    7/2018  Lesartre
2020/0194501 A1*   6/2020  Ge ........................ H01L 45/06

OTHER PUBLICATIONS

Ming Cheng et al., "Time: a Training-in-memory Architecture for Memristor-based Deep Neural Networks," Jun. 18, 2017, pp. 1-6, ACM.

* cited by examiner

METHODS AND SYSTEMS FOR HIGHLY OPTIMIZED MEMRISTOR WRITE PROCESS

DESCRIPTION OF RELATED ART

Memristors are devices that can be programmed to different states by applying a programming energy, for example a voltage or current pulse. The programming energy generates a combination of electric field and thermal effects that are to modulate the conductivity of both non-volatile switch and non-linear select functions in a switching element. After programming, the state of the memristor remains stable over a specified time period, and then the state is thus readable. Memristor elements can be used in a variety of applications, including non-volatile solid state memory, programmable logic, signal processing, control systems, pattern recognition, and other applications. In particular, memristors are fundamental elements in the design of many dot product engine (DPE) based neural network training accelerators.

Despite the plethora of applications of memristors, there are some operational limitations of fabricated devices due to their properties. For example, many fabricated memristors experience a long write latency. On a larger scale, memristors that have increased latency and higher power consumption can have downstream effects on the overall efficiency of the systems that are reliant on memristor-based implementations.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Various embodiments described herein are directed to techniques and hardware circuitry that is configured to optimize a write process for a memristor. In particular, the hardware can include dedicated circuitry, namely a write process optimization circuit, that is designed to shape (e.g., width, slope) and dynamically terminate a memristor's write pulse. The write process optimization circuit can terminate the write pulse at an optimal point, based on the memristor's characteristics. By optimally terminating the write pulse, the write process can be performed in a minimized number of cycles, which realizes a faster overall write process for the memristor and improves the memristor's efficiency.

Figure 7:
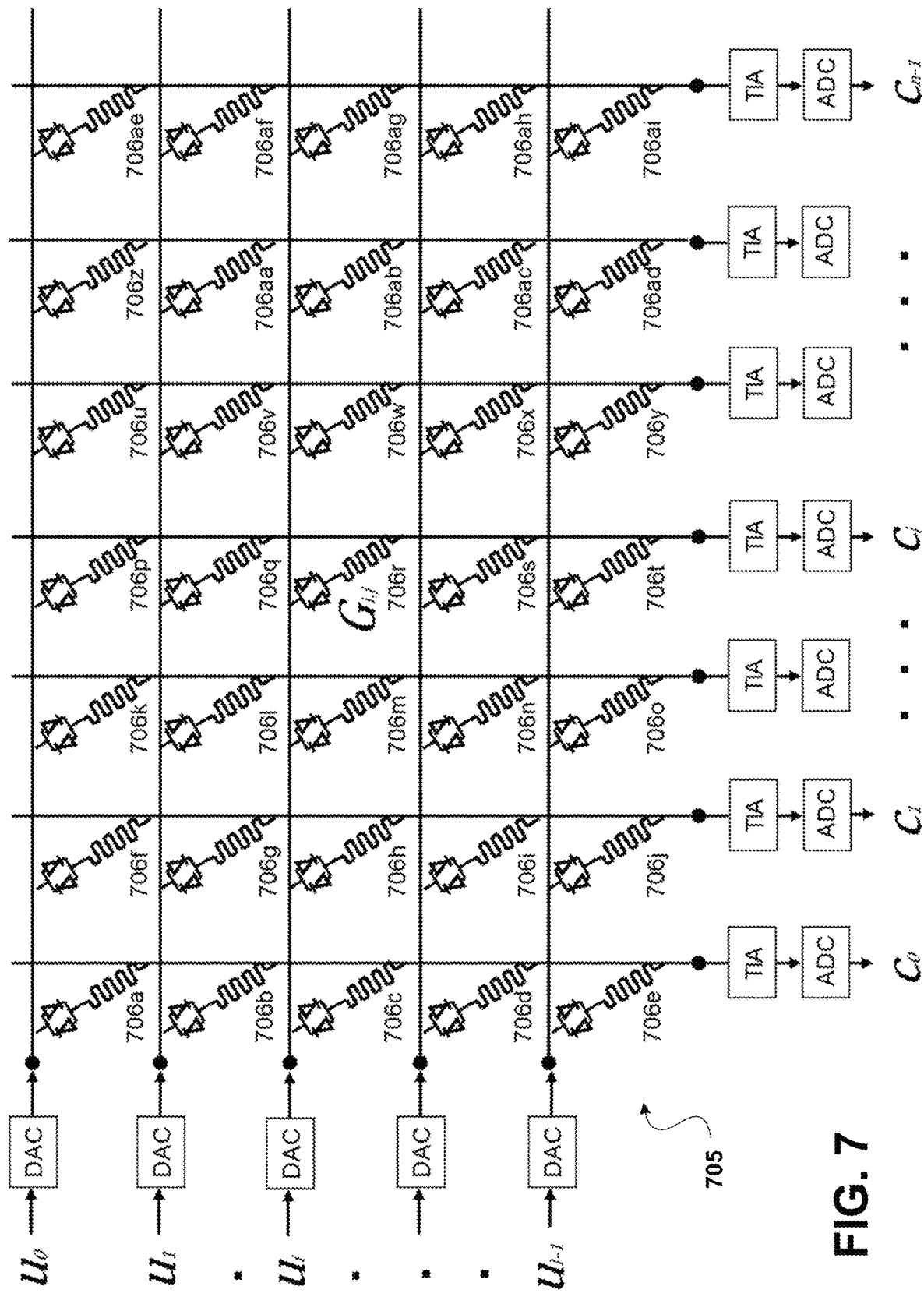
FIG. 7 depicts an example of a memristor crossbar array and a computational model for a dot product engine (DPE) based neural network accelerator embodiment.

Memristors are devices that may be used as components in a wide range of electronic circuits, such as memories, switches, radio frequency circuits, and logic circuits and systems. FIG. 7 shows an example of an application for memristors, illustrated as a crossbar array 705 having multiple memristors 706a-706ai arranged therein. In some cases, the crossbar array 705 can be a memory structure. Even further, the crossbar array 705 can be used in larger-scale systems, such as dot product engine (DPE) based neural network accelerators. In general, the crossbar array 705 in FIG. 7 can be used to implement hardware accelerators for calculating node values for neural networks. As an example, in a neural network processing accelerator, the crossbar array 705 may be programmed to calculate node values. Memory cells of the crossbar array 705 may be programmed according to a weight matrix. Driving input voltages mapped from an input vector through the crossbar array 705 may produce output current values, for example accumulating across column 706a-706e, which may be converted to digital values that represent a matrix-vector multiply result. In this manner, accelerators can provide hardware calculations of node values for neural networks. In the illustrated example, the crossbar array 705 is configured to include contributions from each memristor 706a-706ai in the array. The use of memristors 706a-070ai at junctions or cross-points of the crossbar array 705 enables programming the resistance or conductance (G) at each such junction.

Figure 6A:
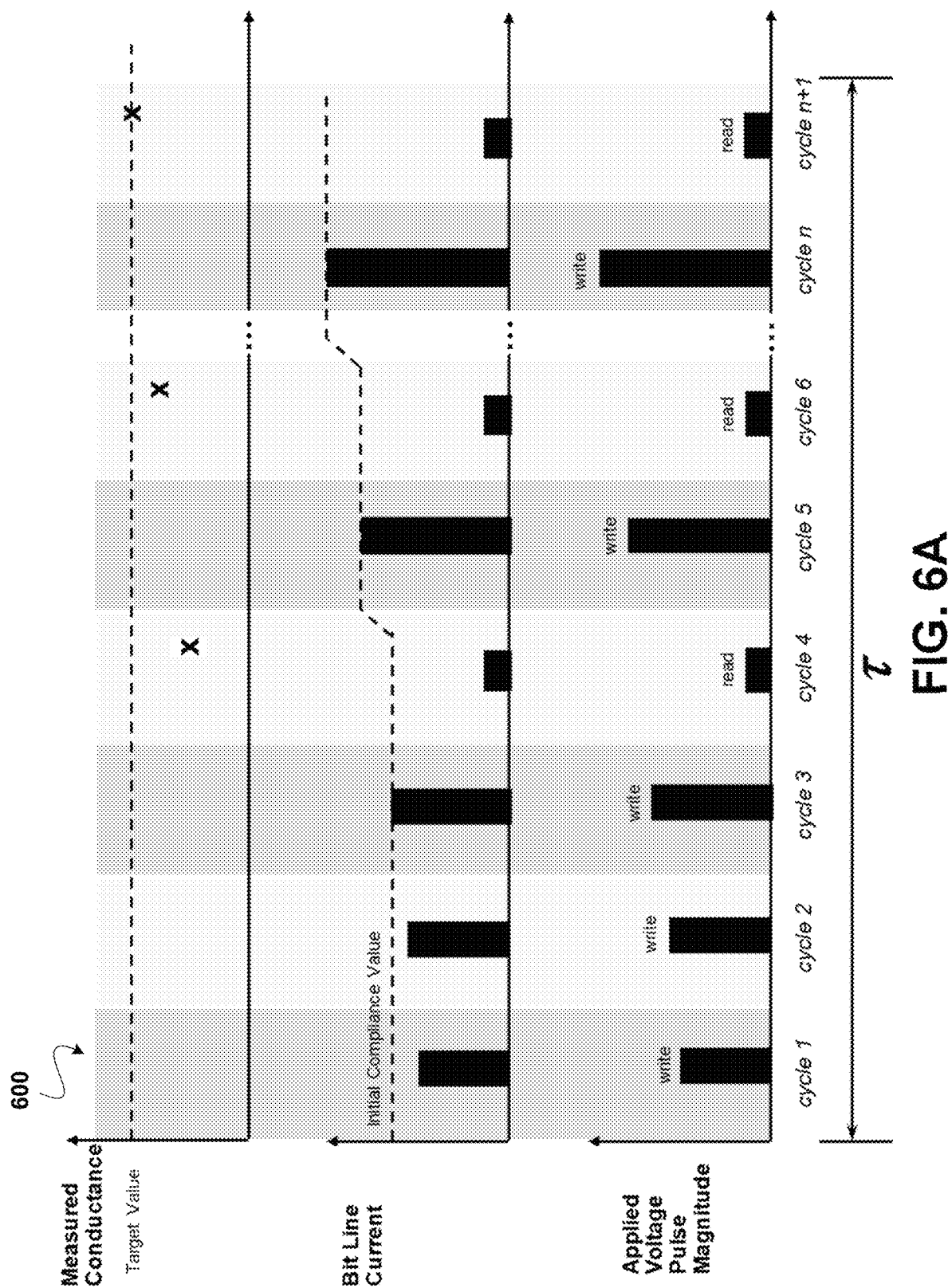
FIG. 6A is a graphical representation of the write process for a memristor in accordance with a conventional iterative write approach.

Employing memristors 706a-706ai to perform vector-matrix computations for neural network process has led to advancements in many metrics (with several order of magnitudes advantage) with respect to conventional processing, such as performance, power, and costs. As alluded to above, memristors are often times at the core in many hardware designs for DPE based processors. Accordingly, an underlying concept in continuing these advancements for DPE based neural network accelerators is improving efficiency of the circuits interfacing to memristors, themselves. Fabricated memristors, based on their properties, can experience long write latency. For example, some memristor implementations have yielded write latencies in the order of several micro-seconds. Memristors inherently have the ability to switch state very quickly, for instance within a few nano-seconds. Despite this ability for extremely fast switching, the operational speed of memristor implementations are still burdened down by the time latency in its write process. Nonetheless, a write process optimization circuit 115 in FIG. 1, as disclosed herein, is particularly designed to manipulate the write voltage that is supplied to a target memristor, shown as memristor 106i, in a manner that optimizes the write process. As a general description, the write process optimization circuit 115 can shape the write voltage and current that is ultimately provided to the target memristor 106i. Other memristors in the array may be similarly selected either as individually or in other embodiments as an entire column and subject to the write process. Many of the existing approaches require iterative write processes, such as Program and Verify (PNV) and Adaptive Write Algorithms. By having an iterative write process, the memristors and interface circuits may exhibit write times that are variable with latencies on the order of several (e.g., one to three) micro-seconds. In FIG. 6A a graphical representation 600 of an example write process for a memristor using PNV or Adaptive Write Algorithm is shown. The graph 600 shows that in a first cycle, a voltage is applied and the corresponding initial current is below the compliance value. In subsequent cycles a different voltage is applied, for instance in cycle 3 where compliance current value is reached. Following the newly applied voltage, a read, such as in cycle 4, is used to verify whether the target conductance value is reached as a result of the series of applied voltage pulses. If the target conductance value is not achieved, in the graph 600, the write process continues these iterations until the target conductance value is reached, terminating after the read in cycle n+1, potentially spanning up to $\tau$ latency (ranging from one to four micro-seconds depending upon the embodiment).

Figure 6B:
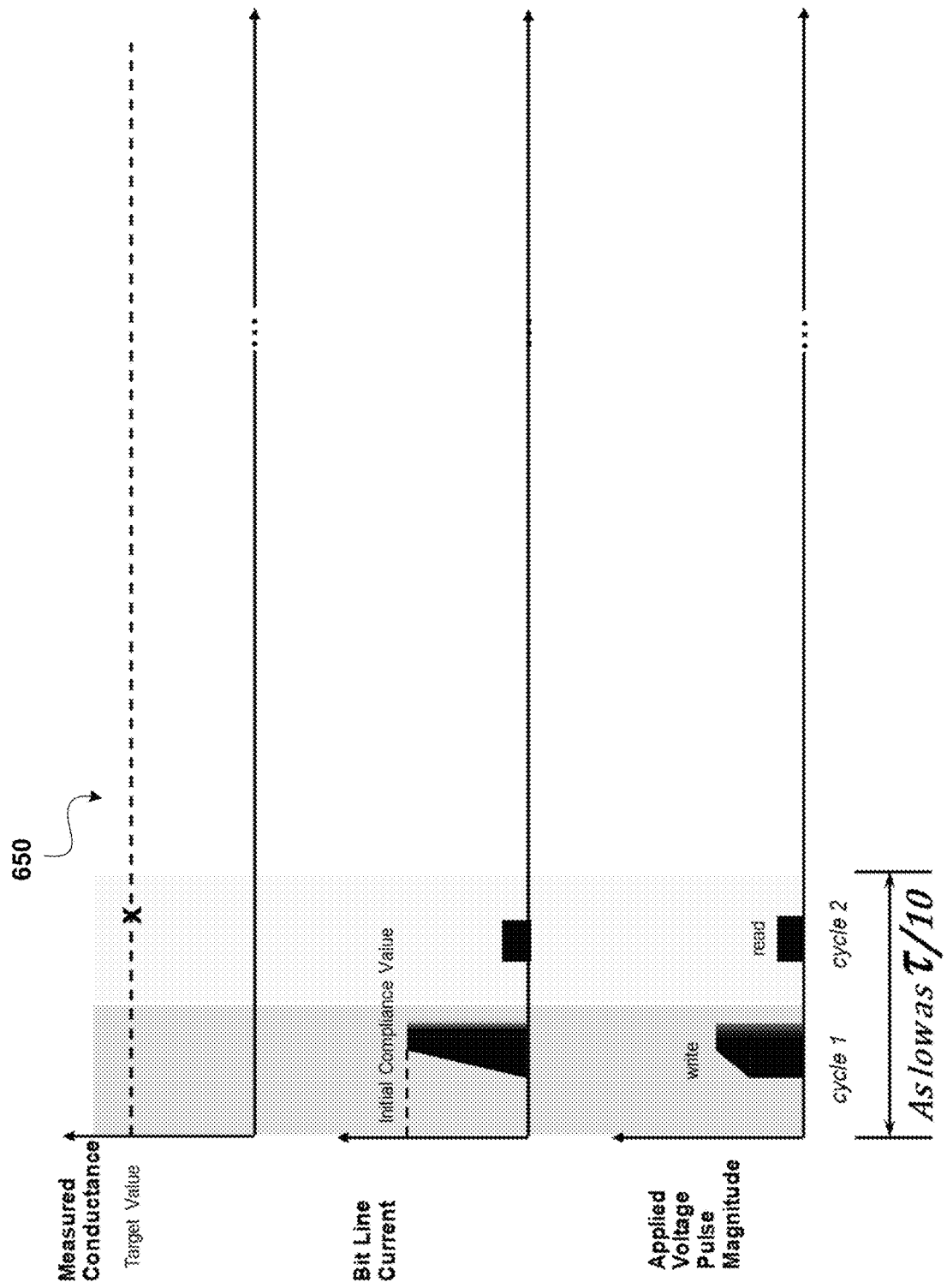
FIG. 6B is a graphical representation of the optimized write process for a memristor as implemented by the write process optimization circuit of FIG. 2B, according to some embodiments.

Conversely, the write process optimization circuit 115 can achieve a reduced write time latency for memristors and ReRAM devices by alleviating the need for inefficient iterations in the write process. The write process optimization circuit 115 can extend and terminate the write pulse at an optimal point, thereby allowing the target memristor's 106i write process to be performed in a single write cycle (as opposed to multiple iterations). Thus, the target memristor 106i can perform its write process in a minimal amount of time (e.g., minimal number of write cycles), realizing improved latency and lower power consumption (in comparison to conventional memristor implementations). In a practical example, the target memristor 106i may experience write latencies as low as $\tau/10$ or one-tenth of $\tau$, representing an approximately 10 times reduction of latency (in comparison with the abovementioned latencies). In FIG. 6B a graphical representation 650 of an example the optimized write process for a memristor is shown. The graph 650 shows that in a first cycle, the applied voltage pulse width can be adjusted in a manner that allows the target value to be met. Subsequently after the completion of read cycle 2 in order to confirm the target conductance value, the write process can terminate, significantly reducing the number of cycles and taking approximately one tenth the latency.

Recently, the emerging memristor device technology has attracted significant research interest, due to its distinctive hysteresis characteristic, which potentially can enable novel circuit designs for future very-large-scale integration (VLSI) circuits. In particular, characteristics such as non-volatility, non-linearity, low power consumption and good scalability make memristors one of the most promising emerging technologies. Some important design parameters, however, such as speed, energy consumption, and variance, are mainly determined by the physical and electrical characteristics of fabricated memristor devices.

Figure 1:
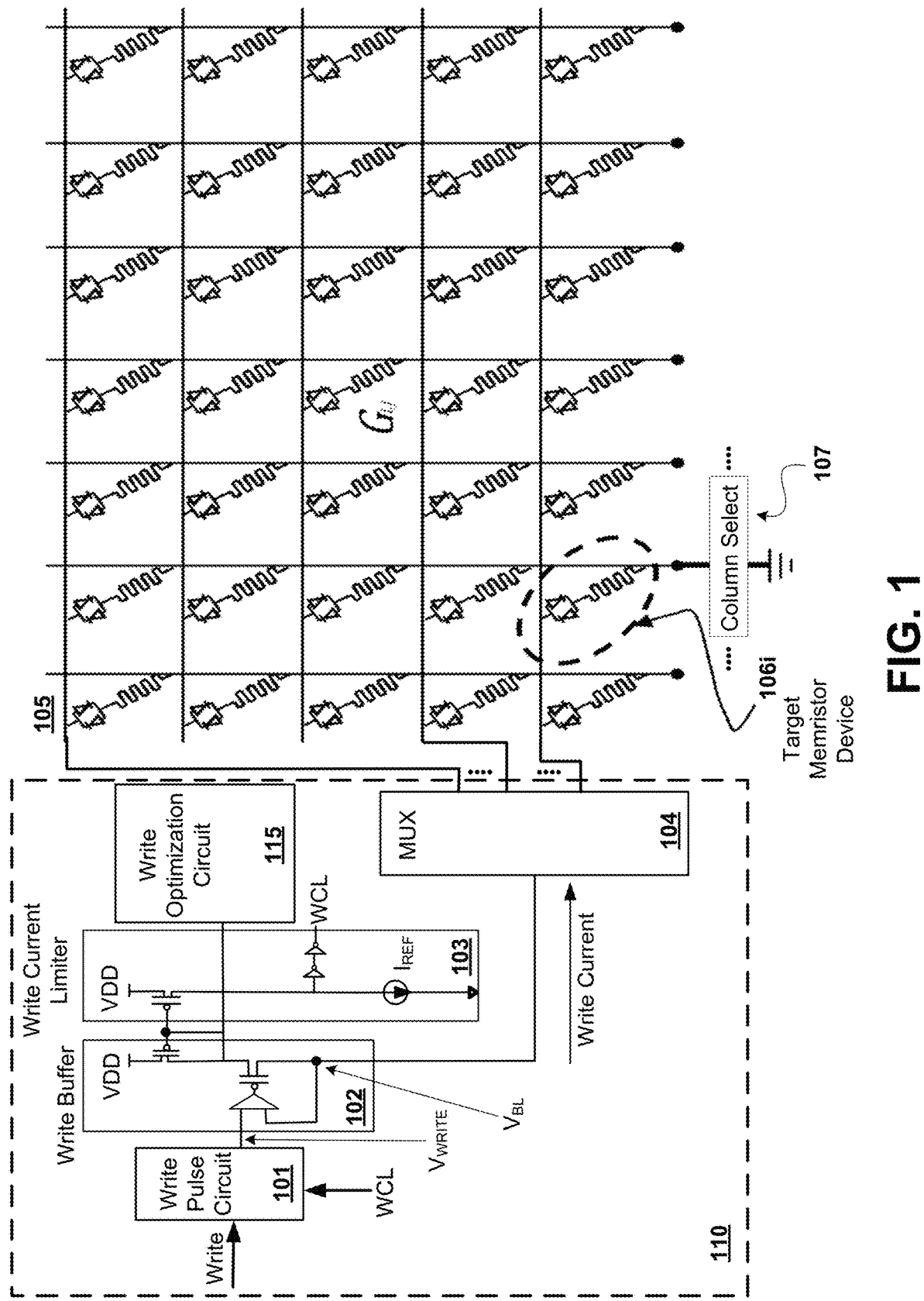
FIG. 1 depicts an example of a memristor crossbar array including a write process optimized memristor device, according to some embodiments.

Now, referring to FIG. 1, an example of a memristor crossbar array 105 including a write process optimization circuit 115 is depicted. As alluded to above, for steady improvement of memristor-based designs, minimizing latency and power consumption are important design metrics (for both high-end computing applications and low-end embedded applications). In the illustrated example of FIG. 1, the target memristor 106i is coupled to peripheral circuitry 110 to implement some of the electronic operations of a memristor, such as writing to change its conductance. As shown, the peripheral circuitry 110 includes: a write pulse circuit 101 for generating the write pulse signal that is supplied to the target memristor 106i; a write process optimization circuit 115; a write buffer 102; a write current limiter 103; a row selection multiplexer (MUX) 104; and a column selector 107. As illustrated in FIG. 1, the peripheral circuitry 110 includes the row selection MUX 104 configured to select a particular row of the memristor crossbar array 105, and the column selector 107 which is configured to select a particular column from the memristor crossbar array 105. The row selection MUX 104 and the column selector 107 can operate in concert in order to select a specific device at the intersection of row and a column to implement a write operation.

In general, the memristor 106i is subjected to a write process that involves changing its internal state, which therefore changes the conduction of the cell. As an example, the writing to memristor 106i can involve applying appropriate voltage pulse to the memristor's 106i cell. By applying a write pulse, for example a square wave, to the cell of the write memristor 106i, the net flux is determined by the magnitude and width of the write pulse (of the input voltage). Thus, the input voltage can be adjusted to ensure the correct write operation to the memristor 106i. Also, FIG. 1 illustrates that a WCL signal can be applied to the write pulse circuit 101 to "turn-off", or otherwise terminate, the write pulse. The disclosed write process optimization techniques leverage this concept, and dynamically shapes the write pulse width to manipulate the memristor's write operation. In particular, the write process optimization circuit 115 is configured to selectively determine a width, and termination point of the write pulse. By controlling the shape of the write pulse, namely the width, slope, and termination of the pulse waveform, the write process optimization circuit 115 can, in turn, impact latency of the write process.

As background, memristors can be described as a circuit element having two-terminals. In between the terminals, a variable defined as flux between the terminals is a function of the amount of electric charge q that can pass through the device, which can be represented mathematically as a function of memristance:

$$d\varphi = Mdq \qquad (1)$$

where M is the memristance

In cases when the relation is linear, memristance M becomes constant and the memristor acts as a resistor. In contrast, in cases when the relation is non-linear, the memristance varies with the charge, which can determine the hysteric behavior of current/voltage profile, and can be defined as M(q). It can be this non-linearity that contributes to longer write latencies that are characteristic of memristors. For example, variability in a required write pulse (e.g., voltage, current) to achieve a particular state for any given device. The variation can be stochastic in nature, thus preventing an systemic approach that a priori identifies devices that are predisposed to a particular write pulse requirement. To address the problem of not having a pre-defined write pulse requirement, many conventional memristor-based system employ Program and Verify (PNV) or Adaptive Write Algorithm techniques in order to ultimately determine this requirement during the memristor's write process. The aforementioned approaches are iterative in nature. In other words, both of the approaches involve increase in set/reset compliance current (or voltage magnitude) in each iteration, as needed, to achieve a target state. Often times, the compliance current values are initially set conservatively, to mitigate the potential of over-write damage. Upon reaching the initial current compliance limit, additional iterations require insertion of additional read cycles. The switching of interface circuits from read to write mode, and then once again returning to read mode, incurs overhead that impacts latency.

The disclosed write process optimization techniques leverage knowledge of certain memristor properties that have been uncovered in recent years. These properties can be manipulated, via interacting with analog circuitry, in a manner that can optimize the write process and improve the memristor's overall efficiency. For example, properties regarding the underlying electronic transport mechanisms and physical conditions in memristor devices are considered. In particular, at low bias, two distinct electronic transport mechanisms have been identified. Temperature studies have been utilized to delineate the two different physics. A parallel conduction model of Mott hoping and Schottky emissions channels can be used to describe the underlying physics.

At low bias temperature, the Mott hopping based transportation model is projected as the dominant conduction channel. Furthermore, a state variable can correlate to density of Mott hopping sites. A Schottky Emission based parallel electronic transport mechanism describes a much lower contribution to currents at low bias and low temperature. However, given the strong temperature dependence of Schottky current, temperature (T) as second state variable in dynamic models can be hypothesized. Additional insight regarding the physical environment within the memristor device during the switching process has also been found. Lateral oxygen migration has been observed, and that establishes the presence of significant Joule heating driven temperature within the conductive core. As the switching process reaches a crescendo, conductive core temperatures can thus be assumed such that the current at device terminals can be attributed to dominance of thermionic emissions over a barrier (most likely due to Schottky electronic transport and/or possibly due to Poole-Frenkel based transport mechanism). In related findings, a root cause for the need to use multiple write-verify cycles can be linked to the above mentioned switching process and resistance states of the memristor, namely the low resistance state (LRS). Two populations of cells have been identified that are being subjected to the write process. A population of "adroit" cells can be described as cells that achieve target LRS states within a single write cycle. A population of "maladroit" cells that require multiple write-verify cycles in order to reach the target LRS states, as implemented by the PNV or Adaptive Write Algorithm approaches. Moreover, it has been shown that at bias conditions, where voltage approaches switching voltage, the internal Joule heating plus high electric field result in dominance of thermionic emissions over barriers (either Schottky and/or Poole-Frenkle). Hence, for a "maladroit" population of cells, the conclusion of the write process at a predetermined current limit represents a premature termination of the initial write pulse.

Under low bias conditions, the conductance of "maladroit" cell populations deviates appreciably from that of "adroit" cell populations. However, as the bias voltage approaches switching voltage, the conductance values of the two cell populations converge. Referring back to the memristor array 105 in FIG. 1, at any given time, a random set of memristors in the array 105 can fall into either one of the "maladroit" or "adroit" populations. For example, memristors 106a-106f may be exhibiting characteristics of "maladroit" cells, while memristors 106g-106l are exhibiting characteristics of "adroit" cells. In some cases, a memristor may even transition between populations. For example, memristor 106i may function like a "adroit" cell during a write operation, then at a later time switch to having characteristics of an "maladroit". The population characteristics of a memristor can vary as a result of several factors, such as a last state, how the memristor was written to, environmental conditions, etc. Due to the randomness and variability of the memristors (with respect to population), it is difficult to categorize memristors into respective populations during a write operation. Even further, this difficulty limits the ability to dynamically optimize a write operation (based on its associated population). In other words, when writing to target memristor 106i, a predetermination of whether it is currently operating in "adroit" population or "maladroit" population. To account for this uncertainty, the abovementioned approaches use the iterative write-verify cycles, applying a write pulse, and then measuring the write current afterwards to determine whether the target state was reached. If not, then the current (or voltage) is changed and another pulse applied. This is repeated until the target state is reached. Each write-verify cycle that is performed before the target state is reached is very costly (for latency), because it involves time for iteratively applying a pulse and additional time (in between each pulse) to determine the state.

Figure 2A:
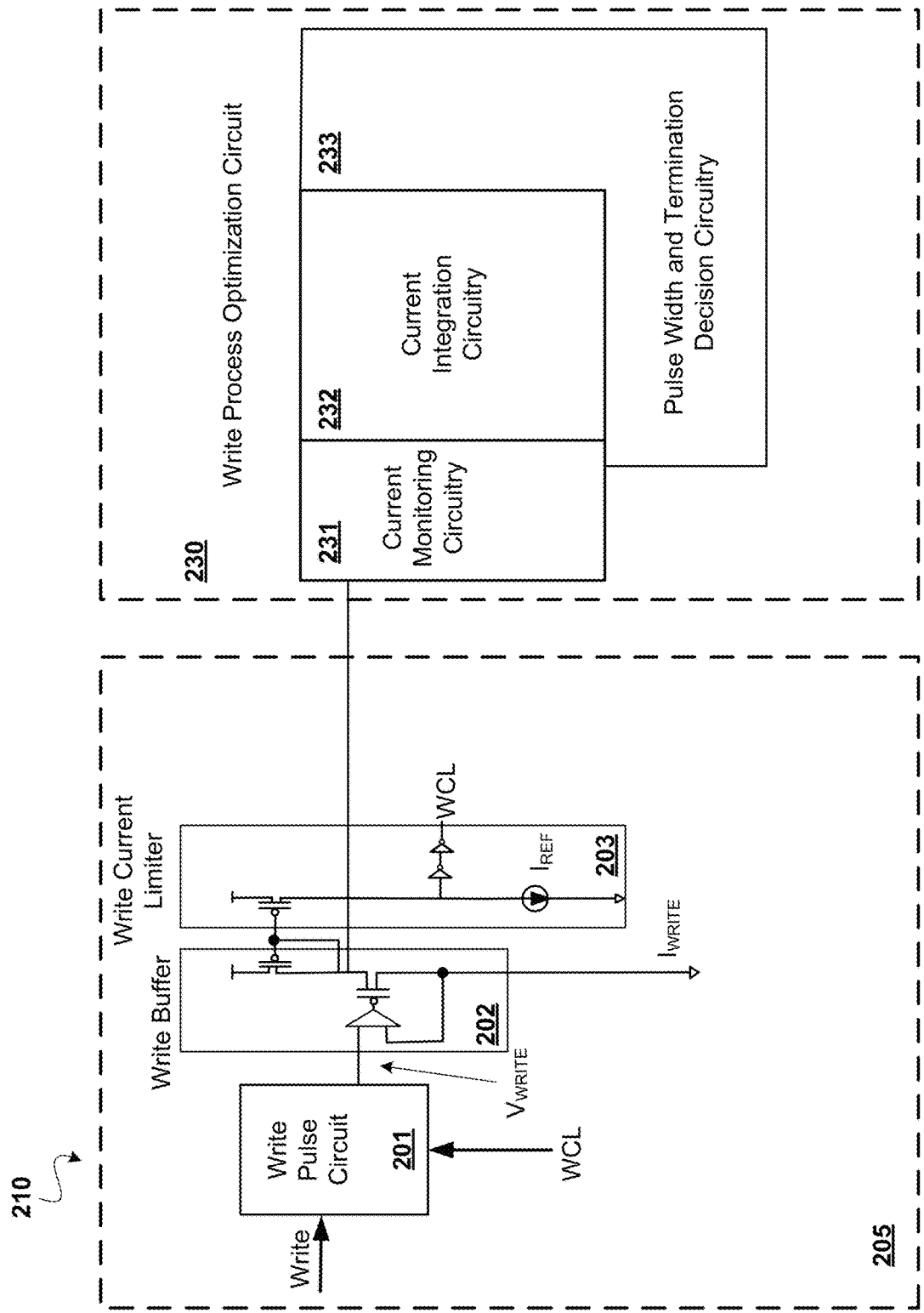
FIG. 2A illustrates a conceptual circuit architecture of a write process optimization circuit, according to some embodiments.
Figure 3:
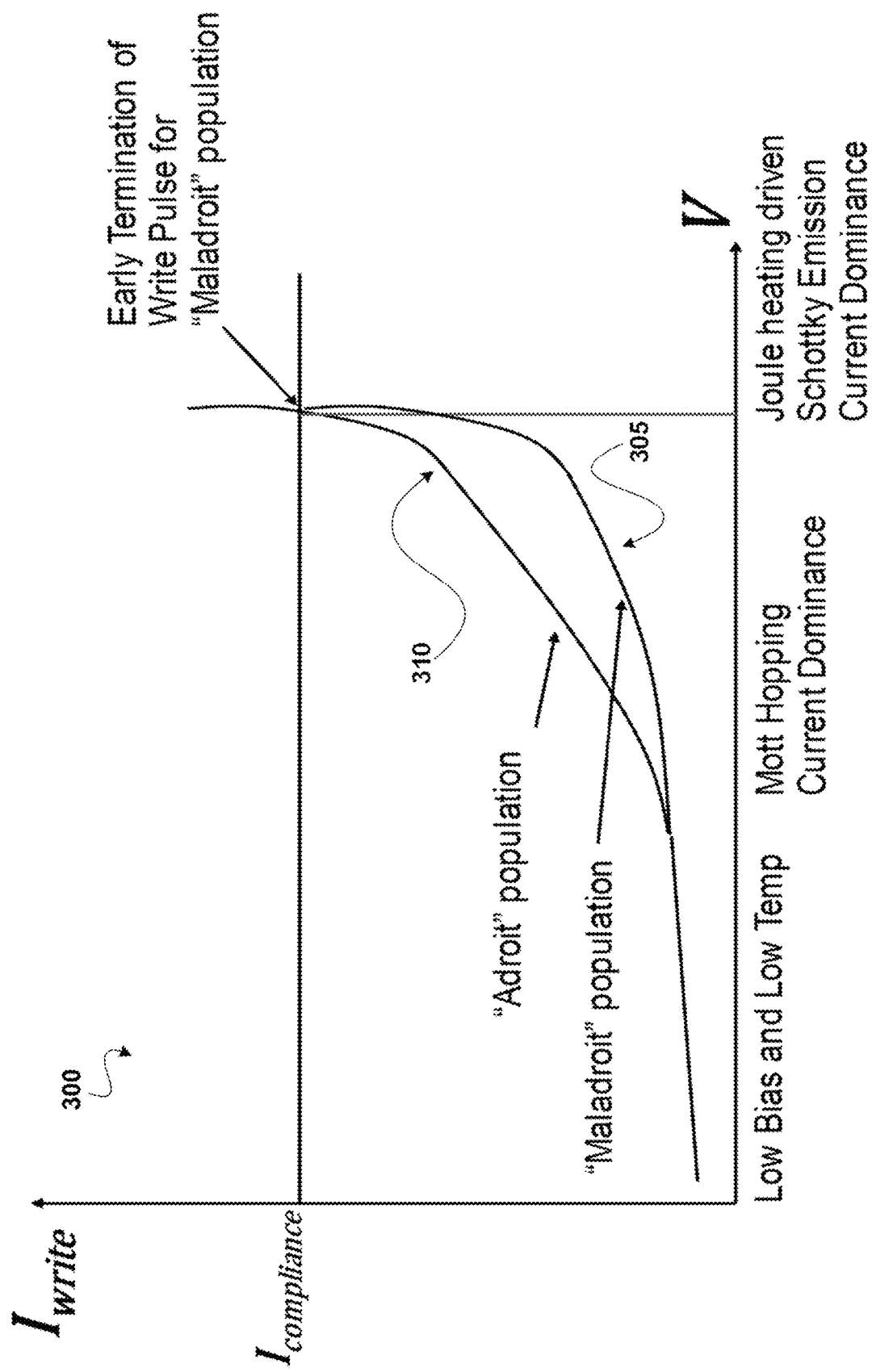
FIG. 3 is a graphical representation of example switching currents for a memristor, including a curve on the graph that corresponds to the switching current for a population of "maladroit" cells and another curve of on the graph that corresponds to the switching current for a population of "adroit cells", according to some embodiments.

Accordingly, the disclosed write process optimization circuit 230, shown in FIG. 2A, is configured to use the write pulse as an indication of which population best characterizes a target memristor's currently behavior. As a result, the write process optimization circuit 230 can correlate a memristor to either a "adroit" population or "maladroit" population in a way that otherwise could not be predetermine before the write operation. For example, the write process optimization circuit 230 shapes the write pulse to accentuate the different current trajectories of memristor cells from the "adroit" cell population and the "maladroit" cell population. In FIG. 3, graph 300 plots a switching current of "adroit" cells with a switching current of "maladroit" cells. This graph 300 serves to illustrate a graphical representation of their respective characteristics. Namely, curve 305 represents the switching current of "maladroit" cells and curve 310 represents the switching current of "adroit" cells having different current trajectories, indicating differing behavior of the cells, particularly in the region where Mott Hopping currents dominate. As a result, shaping the write pulse in a way that accentuates the deviation between the two populations allows the current to be measured and used as an indication to determine whether a memristor is currently behaving as the "adroit" cell population or the "maladroit" cell population, during a write process. Technique for assessing the varying current trajectories over time based on integration of the memristor write current is a key principle of this disclosure.

FIG. 2A prominently shows an example of typical peripheral circuit 210 (also shown in FIG. 1), including an example of a conceptual circuit architecture for the disclosed write process optimization circuit 230. In the example, a section 205 of the typical peripheral circuit 210 is shown to include: write pulse circuit 201; write buffer 202; and write current limiter 203. The section 205 is coupled to the disclosed write process optimization circuit 230. Conceptually, the write process optimization circuit 230 can be comprised of three principal stages of circuitry: current monitoring circuitry 231; current integration circuitry 232; and pulse width and termination circuitry 233.

FIG. 2A is referred to as a conceptual diagram, as the actual circuit elements (or devices) for implementing the disclosed circuit are not shown. Rather, the current monitoring circuitry 231, current integration circuitry 232, and pulse width and termination circuitry 233 represent a logical arrangement of elements within the circuit 230, which are configured to execute a distinct function. For example, the current monitoring circuitry 231 can include circuit elements that perform monitoring of the write current from the memristor element of the write process optimized memristor. The current integration circuitry 232 can include circuit elements that measure the integral of the write current over time. The pulse width and termination circuitry 233 can include circuit elements that particularly shape the write pulse in accordance with a determined width, and termination. In some cases, the termination of the pulse is dynamically determined by the circuitry 233, while the slope and width may be known values, for example through experimentation. The pulse width and termination circuitry 233 relies upon the shape of the write pulse that is applied to the memristor for driving the write operation by circuit 201. As alluded to above, the circuit 201 generates a write pulse that is particularly shaped to accentuate the different trajectories of memristor cells from the "adroit" population and the "maladroit" population, thus enabling the resulting write current to indicate which population is characteristic of the target memristor device. The write pulse can be shaped as a specific waveform, such as a slow ramp up with constant slope or ramp function with plateauing slope during a critical region, and the like. In some embodiments, the write pulse is optimally shaped (e.g., not following the determined shape of a conventional waveform). The precise shape could be empirically determined via experiments. For instance, the write pulse circuit 201 can generate a write pulse that dwells for a longer time at critical regions to further accentuate the different trajectories.

Figure 4:
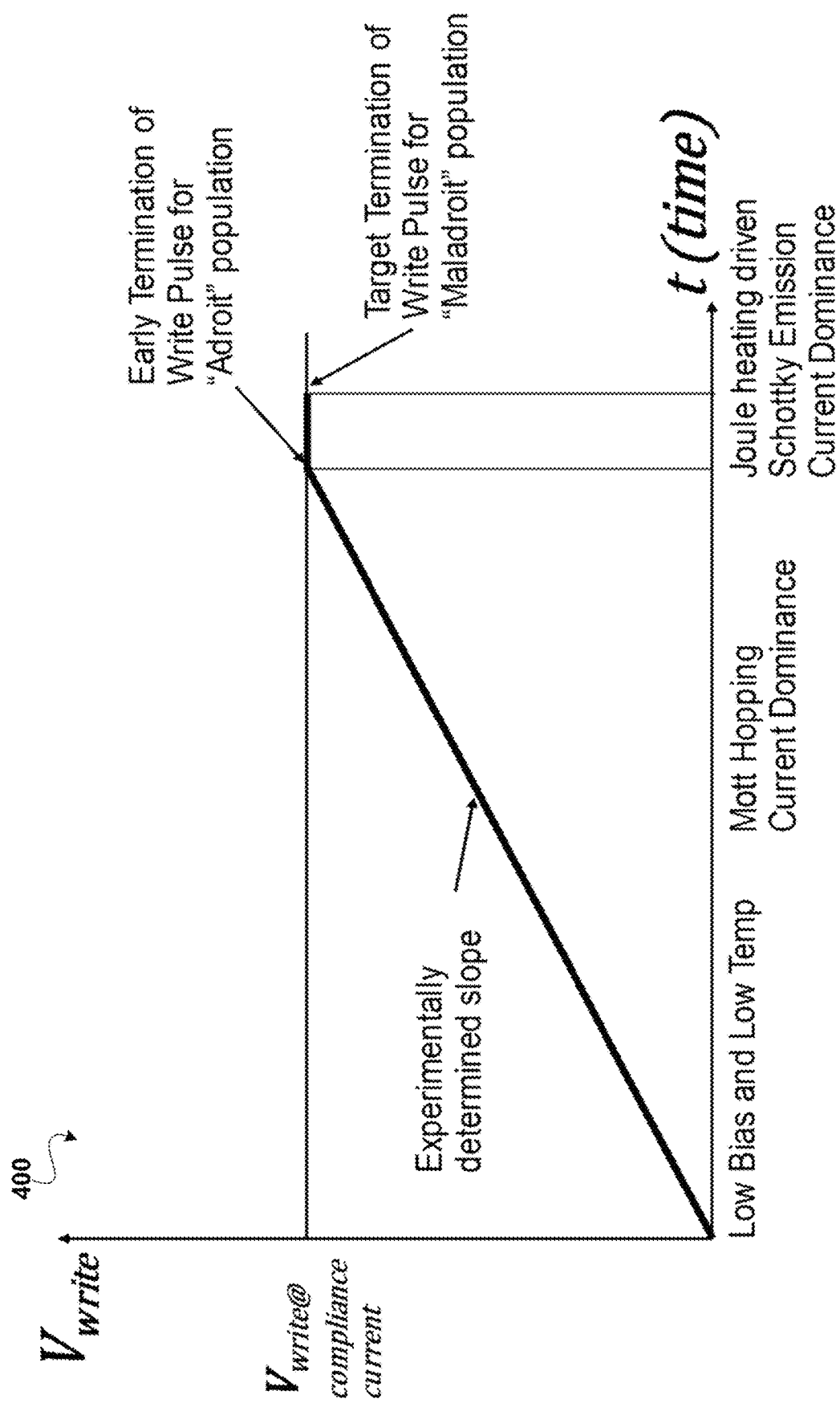
FIG. 4 is a graphical representation of an example write pulse corresponding to a memristor, where the write pulse is shaped using the write process optimization techniques implemented by the write process optimization circuit, according to some embodiments.

With such as write pulse, an integral over time of the write current during the switch process represents a more accurate measure of the success in achieving the target state. For cells in the "maladroit" population, an increased width of the write pulse after reaching a compliance current value can be crucial. A graphical representation of the effect of modulated write pulse as a result of the write process optimization circuit is illustrated by graph 400 in FIG. 4.

Figure 2B:
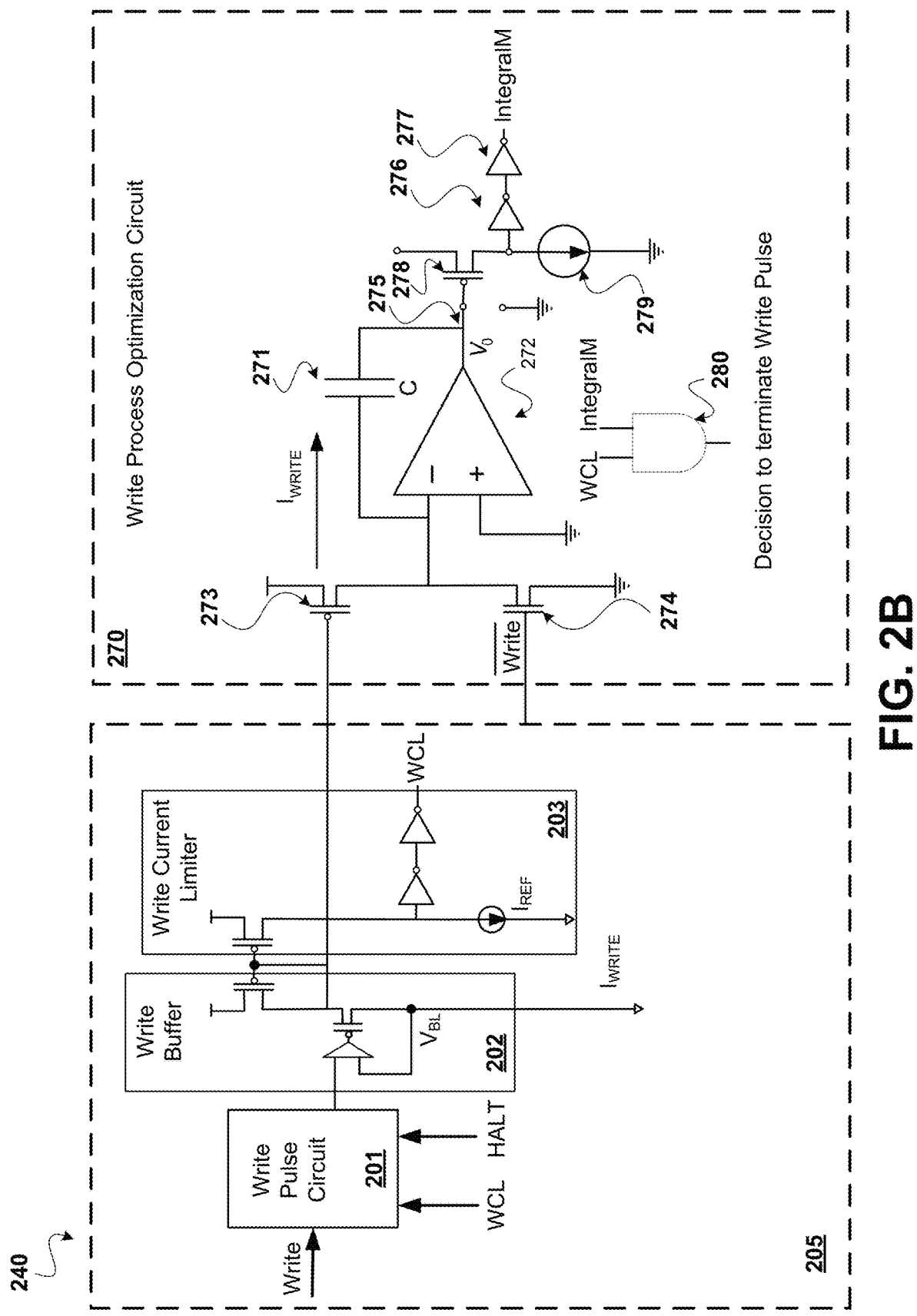
FIG. 2B illustrates an example circuit architecture of a write process optimization circuit, according to some embodiments.

Now referring to FIG. 2B, an example of an actual circuit implementation for the write process optimization circuit 270 is illustrated. The focus of this disclosure is circuit 270. The peripheral circuit 240 includes a section 205 of circuitry as previously described above in reference to FIG. 2A. For purposes of brevity, the configuration and function of the circuitry of section 205 in peripheral circuit 240 is not discussed in detail again. Circuit implementations of function described by section 205 is considered conventional and familiar to those having ordinary skill in the art. It should be appreciated that the example circuit architecture in FIG. 2B is not intended to be limiting, and that the disclosed write process optimization circuit, and its functions, can be implemented using other configurations of circuitry and elements, as deemed appropriate.

Figure 5:
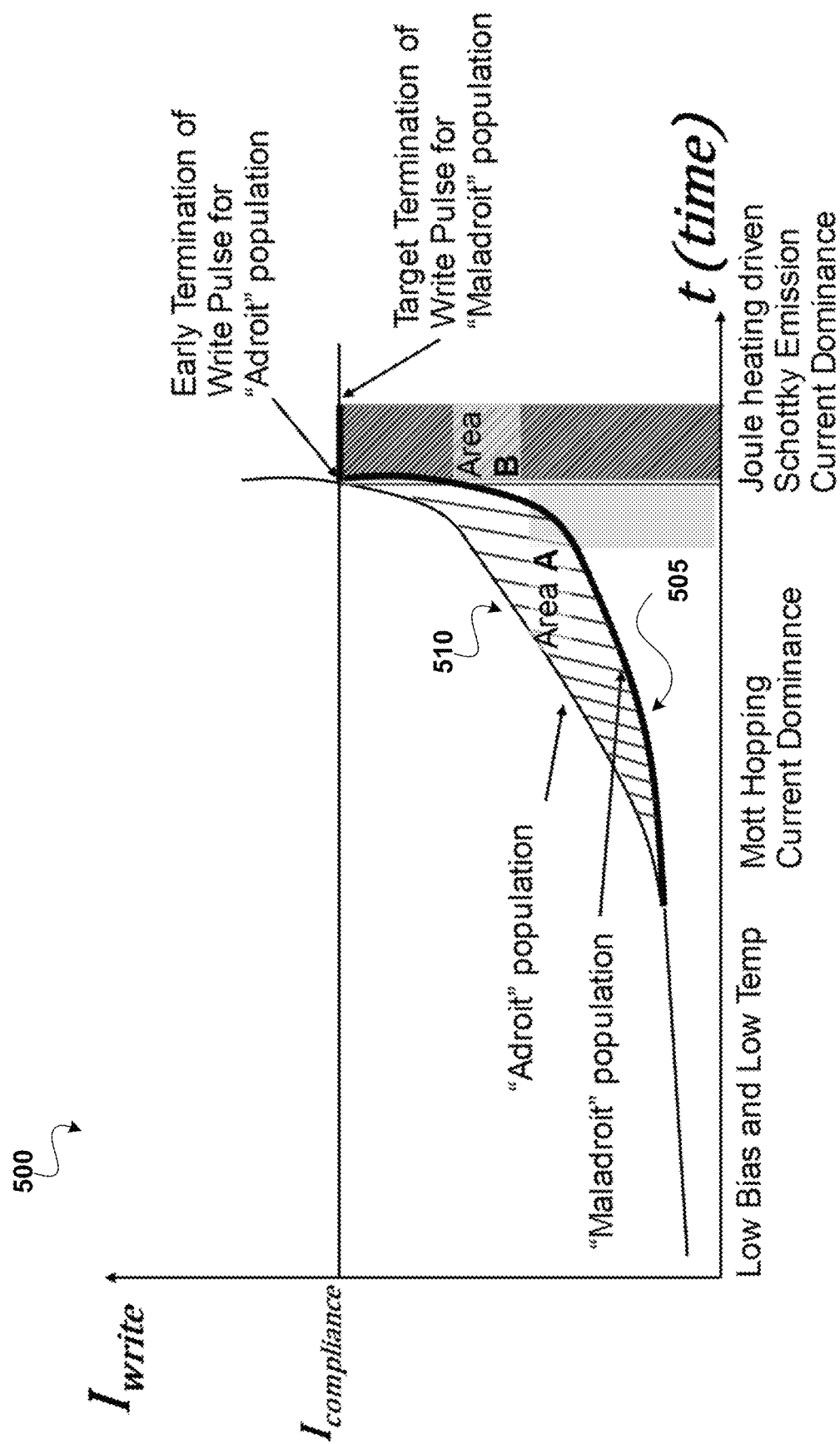
FIG. 5 is a graphical representation of an example of a write pulse corresponding to a memristor, including a curve on the graph that corresponds to the switching current for a population of "maladroit" cells and another curve of on the graph that corresponds to the switching current for a population of "adroit" cells, according to some embodiments.

In FIG. 2B, the write process optimization circuit 270 is shown to connect with write buffer 202. This enables a mirrored generation of write current that is being sensed by the circuit 203. As an example, the current that is being sensed from the current limiter circuit 203 can be represented as the curves of the memristor switching currents that are plotted in graph 500, as seen in FIG. 5.

In the graph 500, a curve 505 represents a switching current corresponding to a population of "maladroit" cells, while curve 510 represents a switching current corresponding to the population of "adroit" population cells. The graph 500 illustrates that the curves 505, 510 have different trajectories, which signifies the different behavioral characteristics of the "adroit" cells as compared to the "maladroit" cells with respect to the physical conditions within the device during memristor switching. An integral of the trajectories of curves 505, 510 can be measured over time. A threshold for an optimal current level may be associated with the integrals. The threshold can be an integration value that represents a point where both the "adroit" cells and "maladroit" cells successfully reach a target state during switching. This integral can be measured by the write process optimization circuit 270. The integrated value is used to subsequently compare to a threshold.

Referring back to FIG. 2B, a replica of a current that flows through a memristor in response to applying a write pulse (generated by the write pulse circuit 201) is created in the write process optimization circuit 270. This replicated current may be input into a capacitor 271 as a current signal ($I_{write}$). The feedback capacitor 271 is coupled to a negative (−) input terminal of an operational amplifier (op amp) 272 at one end, and an output terminal of an operation amplifier 272 at the opposing end. In general, the segment of the circuit 270 that takes the integral of the current includes the op amp 272 and the feedback capacitor 271, and outputs the corresponding signal ($V_o$). In other words, the voltage on the output of the op amp 272 is proportion to the integral of the write current. The op amp 272 is also coupled to two metal oxide field-effect (MOSFET) transistors 273, 274 (also coupled to each other in series), at its negative (−) terminal point. During the write process, transistor 273 generates current that mirrors the memristor current (Iwrite). During the phase—when the write process is disabled, transistor 274 drains the charge on integration capacitor, C, in preparation for next write cycle. The output from the op amp 272 is coupled to another segment of the circuit 270 at a node 275. The node 275 can have a voltage ($V_O$) that represents the measured integral of the memristor's write current, as described above.

As seen in FIG. 2B, the write process optimization circuit 270 can also include a two inverters 276, 277 coupled in series, where the output of inverter 277 is the signal (IntegralM). The inverter 276 is also coupled to a terminal of a MOSFET transistor 278. The MOSFET transistor 278 is also coupled to node 275 by its gate terminal, and a current source 279 at its source terminal. The current source 279 can be set to the empirically predetermined current integral threshold value ($I_{IntegralM}$). Furthermore, the voltage ($V_O$) at node 275 may be represented as the equation below:

$$V_0 = \frac{1}{c} \int_0^t I_{write} dt \qquad (2)$$

As a general description, this section of the circuitry compares the voltage or that integral value to a threshold value represented by the current source 279. When the voltage (or the integral) matches a threshold represented by the value of the current source 279, then the integral under the curve has reach the empirically determined target. In response to the integral value reaching the value of the current source 279, the invertors 276, 277 flip state.

FIG. 2B also shows that circuit 270 includes a NAND gate 280 that receives the output signal from the current write limiter circuit (WCL) and the output signal representing the measured integral (IntegralM). The circuit 270 can be configured to stop, or otherwise terminate, the write pulse based on when the state is flipped (by inverter 276, 277). That is, the write optimization circuit 270 terminates the write pulse when the integral of the curve has achieved a certain threshold, as opposed to just terminating the write pulse when the current has achieved a certain value. The output signal from write current monitoring circuit (WCL) can be compared to a certain value, such as an optimal compliance current. In a similar manner, the output from the integral can be compared to a threshold. Both values are used at the NAND gate 280, to dynamically terminate the write pulse.

Accordingly, due to the write optimization circuit 270 terminating the write pulse at the optimal threshold (which achieves target state for both "maladroit" and "adroit" cells based on the integral of write currents) and when the current has a achieved a certain value, the need for iteratively resetting the current compliance limit and multiple write-verify cycles is eliminated. As such, the write optimization circuit 270 is configured to end the write process for a memristor at an optimal time, where it can be assumed even "maladroit" cells are at a target state in a minimal number of write cycles. In some cases, the write process optimization circuit 270 can achieve the desired target state for the memristor cell in a single cycle. As illustrated in FIG. 5, the write pulse 515 can be shaped by the process optimization circuit 270 to terminate at the time when the write current meets the current compliance limit. Alternatively, when current indicates that a memristor is characteristic of an "maladroit" cell, the termination and the width of the write pulse 515 can be extended by the write optimization circuit. By extending the pulse, it causes the pulse to be terminate at later time, where it is assumed even a memristor having an "maladroit" cell can stably reached the target state. As alluded to above, increasing the width of the write pulse 515 after reaching a current compliance limit may be crucial, and effectively achieves the same stable state results of conventional iterative approaches (e.g., PNV and Write Algorithm Process) without burdening the latency of the write process. As a result, the disclosed write process optimization circuitry and techniques can substantially reduce the write time latency for memristors (and ReRAM devices) by alleviating the need for inefficient iterative write-verify processes that are conventionally used.

The write latency issue and disclosed circuit implementations describe techniques for reducing latency during a memristor "set" process or when the device is switched from higher-resistance state to a lower-resistance state. To those with ordinary skill in the art, it will be apparent that an analogous technique is applicable for a "reset" process or when the device is switched from lower-resistance state to a higher-resistance state. The switching of a fabricated memristor device from lower resistance state to a higher resistance state requires application of the write pulse in the opposite direction from the "set" direction described in the prior paragraphs. The fabricated devices can exhibit similar stochastic variance as during the "set" process that preclude an ability to a priori determine the shape of the required write pulse. The sensing of device currents during the switching process similarly distinguish between populations of cells that are predisposed to "adroit" switching process and those that that fall into the "maladroit" population. Symmetrical circuits measure the trajectory of the current utilizing techniques previously described in the disclosure.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "adroit," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit for optimizing a write process for a memristor, comprising: current monitoring circuitry to monitor a write current corresponding to the memristor; current integration circuitry measuring the monitored write current corresponding to the memristor over a period of time; and voltage pulse shaping circuitry determining, based on the measured write current, a width and a termination point of a write pulse corresponding to the write current applied during the write process for the memristor such that a number of cycles during the write process is minimized.

2. The circuit of claim 1, wherein the current integration circuitry measures an integral of the monitored write current corresponding to the memristor during the write process for the memristor over the period of time.

3. The circuit of claim 2, wherein the integral of the monitored write current represents a target current corresponding to a first target state for a first population of cells for memristors and a second target state for a second population of cells for memristors during the write process of the memristor.

4. The circuit of claim 3, wherein the voltage pulse shaping circuitry determines the width and a slope of the write pulse in a manner that causes a divergence between the first population of cells for memristors and the second population of cells for memristors.

5. The circuit of claim 4, wherein the voltage pulse shaping circuitry shapes the write pulse in accordance with the determined width and an experimentally known slope, and the current monitoring circuitry monitors an adjusted write current corresponding to the shaped write pulse.

6. The circuit of claim 5, wherein the first population of cells for memristors comprises adroit cells that reach the first target state within a single write cycle and the second population of cells for memristors comprises maladroit cells that are associated with additional write cycles to reach the second target state.

7. The circuit of claim 6, wherein the adjusted write current is indicative of whether the memristor is characteristic of the first population of cells for memristors or the second population of cells for memristors.

8. The circuit of claim 7, wherein the voltage pulse shaping circuitry terminates the shaped write pulse when the adjusted write current indicates that the memristor is characteristic of the first population of cells for memristors, the adjusted write current value meets the current compliance limit and the integral of the adjusted write current meets a determined threshold.

9. The circuit of claim 7, wherein the voltage pulse shaping circuitry extends the shaped write pulse prior to termination when the adjusted write current indicates that the memristor is characteristic of the second population of cells of memristors, and terminates the shaped write pulse after the adjusted write current value meets the current compliance limit, and after the integral of the adjusted write current meets a determined threshold.

10. The circuit of claim 9, wherein the current compliance limit is reached within the minimized number of cycles during the write process.

11. The circuit of claim 10, wherein the minimized number of cycles during the write process is less than the additional write cycles associated with the second target state, minimizes the number of write cycles in the write process, and decreases a latency associated with the write process.

12. The circuit of claim 11, wherein the minimized number of write cycles is a single cycle.

13. A method for optimizing a write process for a memristor, comprising: monitoring a write current corresponding to the memristor; measuring the monitored write current corresponding to memristor over a period of time; shaping a write pulse corresponding to the measured write current such that the measured current is indicative of a termination point of the write pulse where the memristor reaches a target state; and terminating the write pulse at the termination point such that a number of cycles during a write process for the memristor is minimized.

14. The method of claim 13, comprises:
measuring an integral of the monitored write current over the period of time.

15. The method of claim 14, comprising:
terminating the write pulse when the monitored write current is at least equal to the current compliance limit and the integral of the monitored write current is at least equal to a threshold value.

16. A circuit for optimizing a write process for a memristor, comprising: the memristor, wherein the memristor comprises a cell; a write pulse circuit coupled to the memristor, wherein the write pulse circuit applies a write pulse to the memristor during a write process; and a write processes optimization circuit coupled to the write pulse circuit, wherein the write processes optimization circuits comprises pulse width and termination circuitry to receive measured write current from write current monitoring circuitry, and shape the write pulse by terminating the write pulse when the measured write current is at least equal to a current compliance limit such that the cell of the memristor reaches a target state in a minimized number of write cycles indicated by signal output from current integration circuitry being at least equal to a threshold value.

17. The circuit of claim 16, wherein the cell of the memristor corresponds to a first population of cells for memristors that reach a first target state in a single write cycle, or a second population of cells for memristors that reach a second target state in a number of write cycles that are larger than a single write cycle.

18. The circuit of claim 17, wherein the write process optimization circuit comprises:
current integration circuitry outputting a signal representing an integral of the write pulse corresponding to the memristor over time.

19. The circuit of claim 18, wherein the write process optimization circuit comprises:
current monitoring circuitry, wherein the current monitoring circuitry measures a write current corresponding to the write pulse.

* * * * *